United States Patent
Hester et al.

(10) Patent No.: US 9,936,282 B2
(45) Date of Patent: Apr. 3, 2018

(54) OVER-SAMPLING DIGITAL PROCESSING PATH THAT EMULATES NYQUIST RATE (NON-OVERSAMPLING) AUDIO CONVERSION

(71) Applicant: Cirrus Logic International Semiconductor Ltd., Edinburgh (GB)

(72) Inventors: Dylan Alexander Hester, Austin, TX (US); Bala Vishnu Shankar Rao, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 58 days.

(21) Appl. No.: 15/099,293

(22) Filed: Apr. 14, 2016

(65) Prior Publication Data
US 2017/0303032 A1   Oct. 19, 2017

(51) Int. Cl.
*H03G 5/00* (2006.01)
*H04R 1/22* (2006.01)

(52) U.S. Cl.
CPC ........... *H04R 1/22* (2013.01); *H04R 2430/03* (2013.01)

(58) Field of Classification Search
CPC .............................. H04R 1/22; H04R 2430/03
USPC .......................................................... 381/98
See application file for complete search history.

(56) References Cited

U.S. PATENT DOCUMENTS

| | | | |
|---|---|---|---|
| 5,559,467 A * | 9/1996 | Smedley | H03F 3/217 330/10 |
| 5,615,234 A * | 3/1997 | Brooks | H03H 17/02 327/551 |
| 6,426,934 B1 * | 7/2002 | Inayama | G11B 20/00007 369/124.01 |
| 7,116,721 B1 | 10/2006 | Melanson et al. | |
| 2002/0000874 A1 * | 1/2002 | Thomasson | H03H 11/126 327/552 |

(Continued)

FOREIGN PATENT DOCUMENTS

WO    2004004120 A2    1/2004

OTHER PUBLICATIONS

Dietrich Schlichthärle, "Oversampling and Noise Shaping" in "Digital Filters", Jan. 1, 2011, XP055330297, ISBN: 978-3-642-14324-3, pp. 469-474, Springer, Berlin.

(Continued)

*Primary Examiner* — Katherine Faley
(74) *Attorney, Agent, or Firm* — Norton Rose Fulbright US LLP

(57) ABSTRACT

The behavior of a NOS DAC and an analog filter may be emulated by electronic components of an integrated circuit (IC) by upsampling data and applying a digital filter to the upsampled data. For example, the IC may include a zero-order-hold circuit that upsamples data from a first input sample rate to a second, higher input rate. The upsampled data may be passed to an Asynchronous Sample Rate Converter (ASRC) that performs further upsampling (e.g., from 8*Fs-64*Fs). The upsampled data may be passed to a digital low pass filter. The digital low pass filter may emulate, for example, a response of a fifth order Butterworth analog filter to mimic the effect of analog processing. The IC may integrate the upsampling circuit, the low pass digital filter, a digital-to-analog converter (DAC) and an amplifier to provide an audio solution for playing high-fidelity music in a mobile device.

27 Claims, 3 Drawing Sheets

(56) References Cited

U.S. PATENT DOCUMENTS

2002/0087319 A1* 7/2002 Stephenson ............. G10L 15/26
704/270
2005/0060142 A1* 3/2005 Visser ................. G10L 21/0208
704/201

OTHER PUBLICATIONS

Oppenheim et al. "Discrete-Time Decimation and Interpolation" Signals and Systems in "Signals and Systems", Jan. 1, 1983, Prentice Hall Career & Technology, Englewood Clif, XP055329427, ISBN: 978-0-13-811175-5, pp. 548-553.

* cited by examiner

US 9,936,282 B2

OVER-SAMPLING DIGITAL PROCESSING PATH THAT EMULATES NYQUIST RATE (NON-OVERSAMPLING) AUDIO CONVERSION

FIELD OF THE DISCLOSURE

The instant disclosure relates to signal processing. More specifically, portions of this disclosure relate to processing audio signals.

BACKGROUND

Conventionally, digital audio is encoded into a file with a pulse-code modulation (PCM)-based format, such as a WAV audio file, with a sample rate of 44.1 kHz. This sample rate results in critically-sampled digital audio that is only sufficient to capture the 20 to 20 kHz audible range for human hearing. When the digital audio is played back by an electronic device, the audio data is input to a digital-to-analog converter (DAC), which in turn drives an amplifier that powers speakers. These DACs often operate at a significantly faster rate than the sample rate of the digital audio, that is a much faster rate than 44.1 kHz. The DACs thus employ oversampling of the input digital audio data to operate on symbols, or units of information, at a much higher sample rate (e.g., in the MHz) than the originally sampled data (e.g., 44.1 kHz). The oversampling places audio distortion that may be caused by aliased images far outside the audible range. Oversampling DACs use digital low pass filters to remove the aliased images before digital-to-analog conversion. However, the low input sample rate (relative to the human limit of hearing) requires that the filters used are high order filters with narrow transition bands. These high-order filters can allow audio up to 20 kHz (the human hearing limit) through but attenuate anything above approximately 24 kHz. These high-order filters provide a "brick wall" frequency response that results in significant spreading of impulse response energy in time. Users may be able to discern the audio distortions introduced by these high order filters and may attribute unnatural sounding and harsh music reproduction to these steep anti-aliasing filters. An illustration of such a system is shown in FIG. 1A.

FIG. 1A is a block diagram illustrating an example playback path with an oversampling digital-to-analog converter (DAC) according to the prior art. A playback path 120 may begin with an audio source 122 that provides data to zero-stuffing block 124 for interpolation. The zero-stuffed audio data is filtered at digital low pass filter (LPF) 126, rate converted at block 128, and filtered again in digital low pass filter 130. The output of digital LPF 130 may be provided to modulator 132, DAC 134, and amplifier 136 for output to speaker 138. The operation of zero-stuffing block 124 and filters 126 and 130 may result in pre- and post-ringing and large group delay in the time domain that may result in audio distortion and/or create up-sampling images in the frequency domain that may result in audio distortion. One solution to avoid the audio distortion created by zero-stuffing block 124 is to use a non-oversampling system that converts critically sampled audio directly from digital to analog, as shown in FIG. 1B.

FIG. 1B is a block diagram illustrating an example playback path for digital audio according to the prior art. A playback path 100 may begin with an audio source 102 that provides digital data to a Nyquist-rate DAC 104 (or "NOS DAC"). The analog output of the Nyquist-rate DAC 104 may be provided to an analog low pass filter 106 and then to an amplifier 108 for output to a speaker 110. Although some audio distortion is avoided through the use of the playback path 100 of FIG. 1B, other audio distortion is added by the playback path 100. This distortion is reduced or removed through the use of the analog low pass filter (LPF) 106 and the inherent filtering effects of the amplifier 108 and speaker 110.

Further, other drawbacks exist with such a system. For example, such a system relies on the DAC 104, amplifier 108, speaker 110, and even the human ear to remove the up-sampling images created when the input data is upsampled. This system reliance leads to variations in perceived sound quality based on factors that cannot be controlled at design time, such as varying hearing capabilities of the listener. Another drawback is that addressing the above issues with additional filtering tends to make custom designs expensive, bulky, and power hungry through added electrical components. For example, a Nyquist digital-to-analog converter (NOS DAC), such as in FIG. 1B, may be one component that may be used to provide the DAC functionality and provide reduction or elimination of up-sampling images. However, NOS DACs are too large, bulky, and power hungry for mobile devices or many other electronic devices. Further, NOS DACs are relatively expensive for devices, and particularly for consumer-level devices.

Shortcomings mentioned here are only representative and are included simply to highlight that a need exists for improved electrical components, particularly for audio components employed in consumer-level devices, such as mobile phones. Embodiments described herein address certain shortcomings but not necessarily each and every one described here or known in the art.

SUMMARY

In certain embodiments, alternatives for processing audio data for output to a transducer are presented that have reduced audio distortions compared to conventional audio processing. As a result of the reduced audio distortions, some embodiments of the invention may be particularly well suited for processing high-fidelity (hi-fi), or high resolution, audio files, such as pulse-code modulation (PCM) data, that the traditional, frequency-domain optimized approach to interpolation in an oversampling DAC. Further, some embodiments of the invention may be particularly well suited for mobile devices or other devices with limited power storage, heat dissipation, or size constraints, because the audio processing components may be implemented, in part, with a digital filter, rather than a NOS DAC and associated analog circuits.

In one embodiment, the functionality of a NOS DAC may be emulated by electronic components of an integrated circuit (IC) that upsample data and apply a digital low-pass filter to the upsampled data. For example, the IC may include a zero-order-hold circuit that upsamples data from a first input sample rate (e.g., 1*Fs-8*Fs) to a second, higher input rate (e.g., 8*Fs), where Fs is a base frequency for the audio data. The upsampled data may be passed to an Asynchronous Sample Rate Converter (ASRC) that performs further upsampling (e.g., from 8*Fs to 64*Fs). The upsampled data may be passed to a digital low-pass filter. The digital low-pass filter may emulate, for example, a response of a fifth-order approximation to a Butterworth analog filter to mimic the effect of analog processing. Although, a fifth-order Butterworth filter is described in one embodiment, the invention is not limited to such a response, but may include other approximations of responses (e.g., second order, third order, etc.) and other types of filters (e.g., Butterworth, Bessel, etc.). Certain embodiments implement configurations of audio circuitry that may differ from conventional design by optimizing the circuitry for improved time domain response rather than frequency domain response.

An output of the IC may be provided to one or more additional components that prepare the processed audio signal for output, such as to a transducer. In one embodiment, a current-mode DAC configured as an analog finite impulse response (FIR) filter may receive an output of the ASRC and generate a current signal corresponding to the output of the ASRC. An I/V converter amplifier may be coupled to the current-mode DAC to convert the current signal to a voltage signal having sufficient amplitude to drive headphones, a speaker, or another transducer.

In one embodiment, the components described for audio processing, such as upsampling and digital filtering, and the additional components for driving a load may be integrated in a single integrated circuit (IC). In some embodiments, some or all of the components may be integrated into a digital-to-analog converter (DAC) IC. In some embodiments, some or all of the components may be integrated into a modulator, such as one described in U.S. Pat. No. 7,116,721, which is incorporated by reference. Such a modulator may be, for example, a pulse-width modulation (PWM) modulator operating at 64*Fs.

Conventional audio processing systems focus on optimizing frequency domain characteristics of the overall system. Frequency optimization produces artifacts in the time-domain representation of the processed audio signal, such as pre- and post-ringing and large group delays. Each of these may contribute to unnatural sounding music reproduction that can be particularly noticeable with high-fidelity music. In contrast, embodiments of the disclosed invention, may implement time-domain optimization of an impulse response of a system. Thus, pre-ringing, post-ringing, and phase distortion may be simultaneously minimized in the audio band of human hearing.

According to one embodiment, a method for processing digital audio data may include receiving an input signal at a first frequency; upsampling the input signal to achieve a plurality of samples at a second frequency higher than the first frequency that correspond to the input signal; and/or filtering, with a digital low pass filter that models an analog low pass filter, the upsampled plurality of samples, wherein the filtering implements a filter corner that is higher than a Nyquist frequency of the input signal. In some embodiments, the method may also include modulating the filtered plurality of samples at the second frequency, and/or driving an output with the modulated filtered plurality of samples, in which the step of driving the output may include driving an amplifier for a transducer, wherein the input signal is an audio signal and the transducer may reproduce sounds encoded in the audio signal.

In certain embodiments, the step of filtering may include applying a filter with a filter corner that is at least double the Nyquist frequency of the input signal; the step of filtering may produce a filtered plurality of samples having a linear phase response in an audio band; the steps of sampling and filtering may model operation of a Nyquist digital-to-analog converter (DAC) and an analog low pass filter; the first frequency and the second frequency may be unrelated; the step of filtering may result in nearly zero pre-ringing in the filtered upsampled plurality of samples; the step of sampling may include applying a rectangular transform in a time domain to the plurality of samples to apply a Sinc transform in a frequency domain; the step of filtering may include applying an approximation of a Butterworth filter to the upsampled plurality of samples with the digital low pass filter; the step of filtering may include applying a fifth-order approximation of a Butterworth filter to the upsampled plurality of samples with the digital low pass filter; and/or the step of filtering may include applying an approximation of a Bessel filter to the upsampled plurality of samples with the digital low pass filter.

According to another embodiment, an apparatus may include digital circuitry, such as a controller, configured to perform steps comprising receiving an input signal at a first frequency; upsampling the input signal to achieve a plurality of samples at a second frequency higher than the first frequency that correspond to the input signal; and/or filtering, with a digital low pass filter that models an analog low pass filter, the upsampled plurality of samples, wherein the filtering implements a filter corner that is higher than a Nyquist frequency of the input signal. In some embodiments, the controller may be further configured to perform steps including modulating the filtered plurality of samples at the second frequency; driving an output with the modulated filtered plurality of samples; and/or drive an amplifier for a transducer, wherein the input signal is an audio signal and the transducer reproduces sounds encoded in the audio signal.

In certain embodiments, the controller may be configured to perform filtering by applying a filter with a filter corner that is at least double the Nyquist frequency of the input signal; the filter may be configured to produce a linear phase response in an audio band; and/or the steps of sampling and filtering may model operation of a Nyquist digital-to-analog converter (DAC) and an analog low pass filter.

According to another embodiment, an apparatus may include an input node for receiving a digital input signal; an upsampling circuit coupled to the input node and configured to upsample digital data in the digital input signal to obtain a plurality of samples at a second frequency higher than a first frequency of the input signal; and/or a digital filter coupled to the upsampling circuit and configured to filter the plurality of samples with a filter corner that is higher than a Nyquist frequency of the input signal. In one embodiment, the upsampling circuit may be configured to perform zero-order holding to upsample the digital input signal to the second frequency.

In certain embodiments, the apparatus may also include a pulse width modulation (PWM) modulator coupled to the digital filter; a digital-to-analog converter (DAC) coupled to the pulse width modulation (PWM) modulator and configured to output an analog signal corresponding to the received digital input signal; and/or an amplifier coupled to the digital-to-analog converter (DAC) and configured to drive a transducer, wherein the input signal is an audio signal and the transducer reproduces sounds encoded in the audio signal. In one embodiment, the upsampling circuit, the digital filter, the pulse width modulation (PWM) modulator, the digital-to-analog converter, and the amplifier may be integrated in a single integrated circuit (IC) chip.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2:
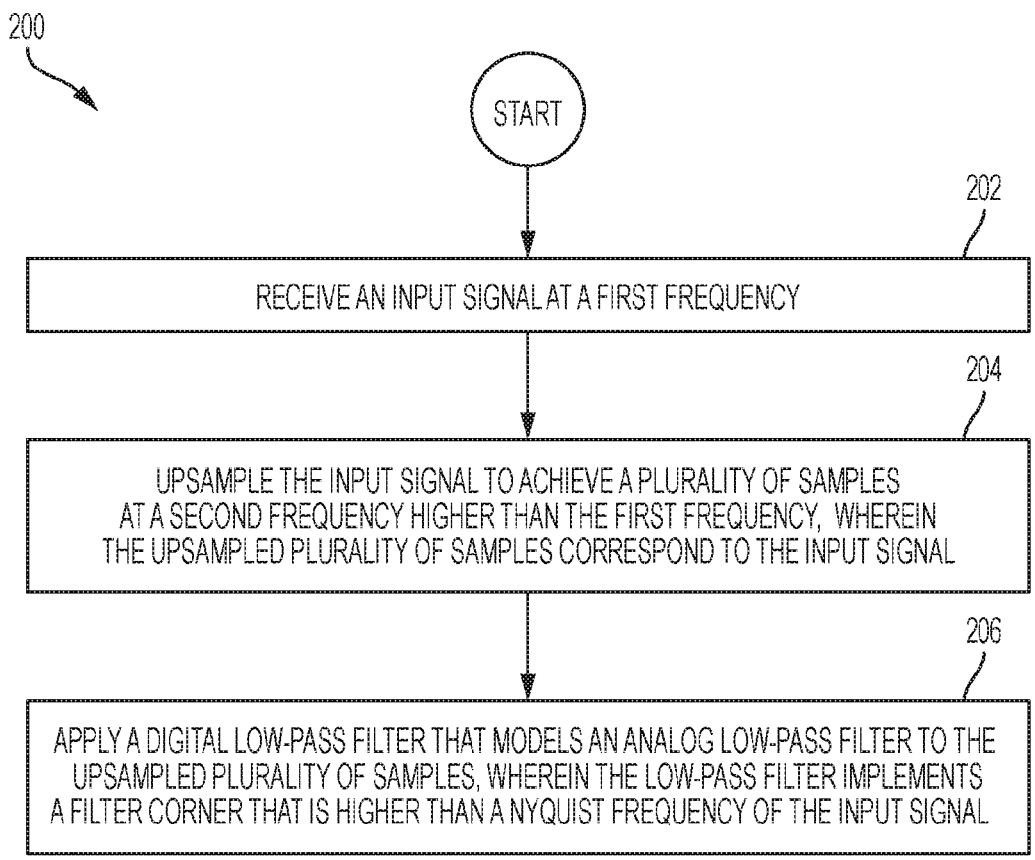
FIG. 2 is a flow chart illustrating an example method of processing digital audio according to one embodiment of the disclosure.

FIG. 2 is a flow chart illustrating an example method of processing digital audio according to one embodiment of the disclosure. A method 200 may begin at block 202 with receiving an input signal at a first frequency, or base frequency Fs. The received input signal may be digital audio data, such as pulse-code modulation (PCM) data or other data. In one embodiment, the base frequency Fs may be at least 44.1 kHz, such that the data rate provides at least a critically sampled rate for the human audible range of 20 Hz-20 kHz. At block 204, the received input signal may be upsampled from a first frequency to a second frequency, which is higher than the first frequency and may be a multiple of the first frequency. For example, the input data may be upsampled from the base frequency Fs to 8*Fs or from the base frequency Fs to 64*Fs. The upsampling of block 204 may result in a plurality of samples containing the data received in the input signal of block 202.

After upsampling the input data, the upsampled data may be passed to a digital low-pass filter at block 206. The low-pass filter may implement a filter corner that is higher than a Nyquist frequency of the input signal, such as higher than the base frequency Fs. The function of blocks 204 and 206 in upsampling and filtering, respectively, in the digital domain may emulate the functionality of a Nyquist DAC and an analog low-pass filter. The similar functionality may be obtained with lower power consumption and smaller components because of the processing performed in the digital domain, such as the filtering by the digital low-pass filter at block 206, rather than in the analog domain.

Figure 3:
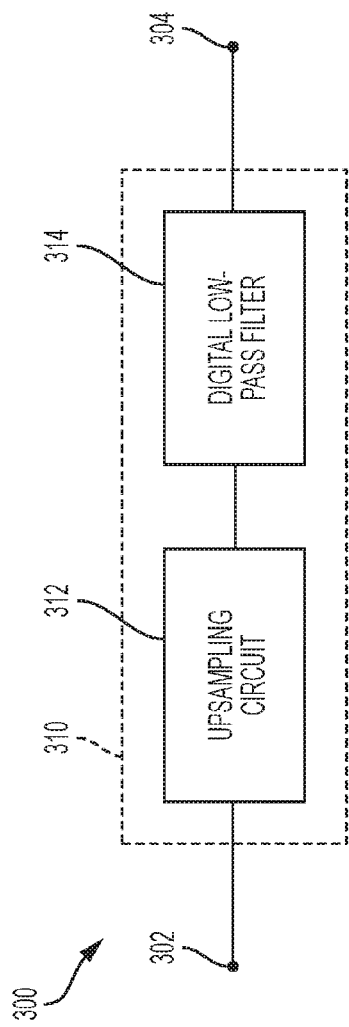
FIG. 3 is a block diagram illustrating an example playback path for digital audio according to one embodiment of the disclosure.

A system for emulating a Nyquist DAC and an analog low-pass filter is shown in FIG. 3. FIG. 3 is a block diagram illustrating an example playback path for digital audio according to one embodiment of the disclosure. A system 300 may include an input node 302 for receiving input digital data, such as PCM-formatted audio data. The system 300 may output, at output node 304, a processed digital signal for further processing and/or output to a transducer. The system 300 may include digital circuitry 310, such as an audio processor or controller or other logic circuitry. The digital circuitry 310 may include an upsampling circuit 312 and a digital low-pass filter 314. The digital circuitry 310 may implement the upsampling circuit 312 and the digital low-pass filter 314 as hard-wired functionality or programmable functionality. In one embodiment, the programmable functionality for digital circuitry 310 may include a digital signal processor (DSP) or other processor executing software, firmware, or a combination of both to perform the upsampling and filtering functions. In one embodiment, the digital circuitry 310 may also include a modulator. In one embodiment, the digital circuitry 310 may include an asynchronous rate converter (ASRC). The digital circuitry 310 may be configured to optimize a time-domain response by applying a rectangular transform in the time domain, which results in a Sinc transform in the frequency domain. This differs from conventional systems that may optimize a frequency domain response by applying a Sinc transform in the time domain, which results in a rectangular transform in the frequency domain.

The upsampling circuit 312 may sample the input node 302 at a rate higher than the rate the data at the input node 302 changes to obtain oversampled data. For example, the upsampling circuit 312 may sample a signal with a base frequency Fs at a rate of 8*Fs, or another multiple of the base frequency Fs. The upsampling circuit 312 may implement, in one embodiment, a zero-order-hold (ZOH) that samples the input node 302 and holds the sample value for more than one cycle of a clock controlling the upsampling circuit 312. The use of the zero-order-hold (ZOH) assists in modeling a NOS DAC system. In one embodiment, the upsampling circuit 312 may include circuitry to read from a register file coupled to the input node 302, and the upsampling circuit 312 may sample the register file at a rate higher than the base frequency Fs to sample the register file multiple times before the register file being updated with new input data such that the upsampling circuit 312 oversamples the register file. The upsampling circuit 312 may include other components for further upsampling of the input signal or for asynchronous operation. For example, the upsampling circuit 312 may include a second upsampling stage that upsamples from the upsampled rate to a second, higher upsample rate. In one embodiment, the 8*Fs rate may be further upsampled to 64*Fs. In some embodiments, the second higher upsample rate may be unrelated to, or asynchronous with, the base frequency, such as by being a ratio that is not an integer multiple of the base frequency.

The digital low-pass filter 314 may implement a filter that emulates an analog low-pass filter. For example, the digital low-pass filter 314 may implement a Butterworth or Bessel filter of a first, second, third, fourth, fifth, or other order. In one embodiment, the digital low-pass filter 314 is configured with a filter corner above the Nyquist-rate of the input data. Setting a filter corner, such as a LPF −3 dB corner, to be at least double the highest frequency of interest, which is generally 20 kHz for audio, introduction of audio band phase distortion by the LPF may be reduced or eliminated. Thus, in one embodiment, the filter corner may be set at 50 kHz, which is above the Nyquist-rate of the input data. A filter corner of at least double the highest frequency of interest provides for reduction in phase distortion in the audio band of interest and a better time domain response. In contrast, conventional digital low pass filters for audio systems conventionally implement a filter corner near the edge of the audio band, e.g., 20 kHz. The higher filter corner, such as at least double the highest frequency of interest, may be less capable of image rejection in comparison to a filter with a filter corner near the highest frequency of interest.

Figure 1A:
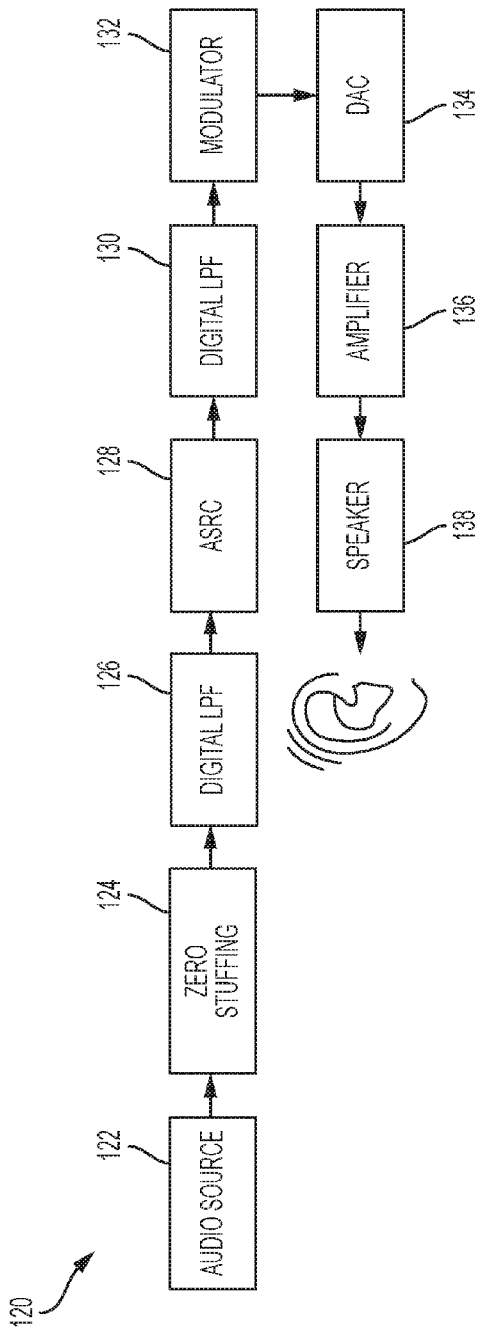
FIG. 1A is a block diagram illustrating an example playback path with an oversampling digital-to-analog converter (DAC) according to the prior art.

The implementation of a higher filter corner provides for better time domain response of the filter, whereas conventional filters are designed to improve frequency domain responses. Filters are conventionally designed for frequency domain effects, e.g., image rejection, such that that higher filter orders are required to obtain the "brick wall" effect described in the background above. Conventional digital filter design techniques are thus applied to obtain an optimal design for those specifications. The digital low pass filter of certain embodiments of this invention instead are configured to achieve better time domain response by using relatively lower order filters, such as would be used in a true analog implementation being modeled by the digital filter, while accepting reduced frequency domain performance and thereby accepting inferior image rejection. By configuring the digital low pass filter to optimize for time domain response and accept reduced image rejection, other components of the system 300 may be selected to provide for modeling the NOS DAC. For example, a zero-order-hold upsampling circuit conventionally does not lend itself well to the optimizations required for high image rejection of conventional systems, such as described with reference to FIG. 1A.

The combination of the filter 314 with the upsampling circuit 312 may emulate a system having a Nyquist-rate (non-oversampling) DAC followed by an analog low pass filter. In one embodiment, a digital processing path from the input node 302 to the output node 304 may emulate a primarily analog path that includes emulating a Nyquist rate (non-oversampling) DAC with a digital zero order hold and highly oversampled digital low-pass filter. In one embodiment, an output of the filter 314 may have a linear phase response within the audio band. By implementing a filter with linear phase response, a constant group delay in the bandwidth of interest may be approximately maintained. For example, an audio band square wave input may be accurately reproduced at the output when a linear phase response is present because all harmonics of the square wave add coherently in time. In some embodiments, the filter 314 may provide for a combination of time coherent output (to improve linear phase performance in band) and short impulse response (to reduce, minimize, or eliminate pre-echo and post-echo energy spreading of the impulse response. When the digital circuitry 310 is included on a single chip, a single-chip highly-oversampled digital-to-analog converter may be constructed.

Figure 4:
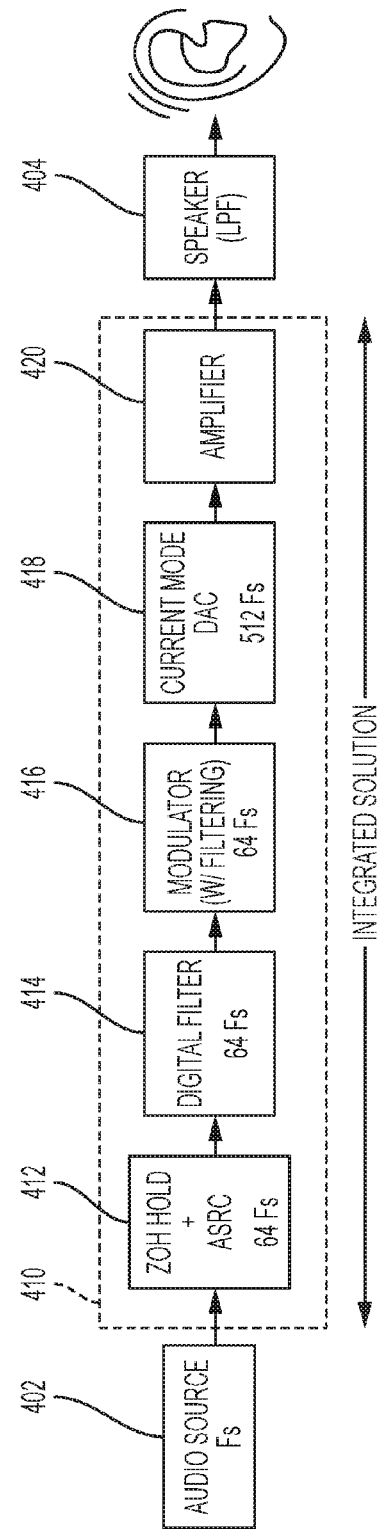
FIG. 4 is a block diagram illustrating an example integrated circuit (IC) for playback and reproduction of digital audio according to one embodiment of the disclosure.

A digital processing path that emulates a Nyquist rate DAC and analog filter may be integrated in a single chip with electronic components for reproducing the audio sounds contained within the digital input data. A single chip audio processor may be particularly advantageous for a mobile device such as a portable media player. One embodiment of such a single chip is shown in FIG. 4. FIG. 4 is a block diagram illustrating an example integrated circuit (IC) for playback and reproduction of digital audio according to one embodiment of the disclosure. A single chip 410 may include an ASRC 412 that implements a zero-order-hold (ZOH) to upsample data received from an audio source 402 from a base frequency Fs to an upsampled frequency, such as 64*Fs. The ASRC 412 may also allow asynchronous operation, such that the chip 410 may operate from a different clock than the audio source 402. The audio source 402 may be, for example, a memory card or internal memory that stores music files or audio files, such as ringtones or notification sounds. The audio source 402 may also be a wireless radio that receives audio data from remote sources, such as music services transmitting over a cellular or other wireless radio.

Figure 1B:
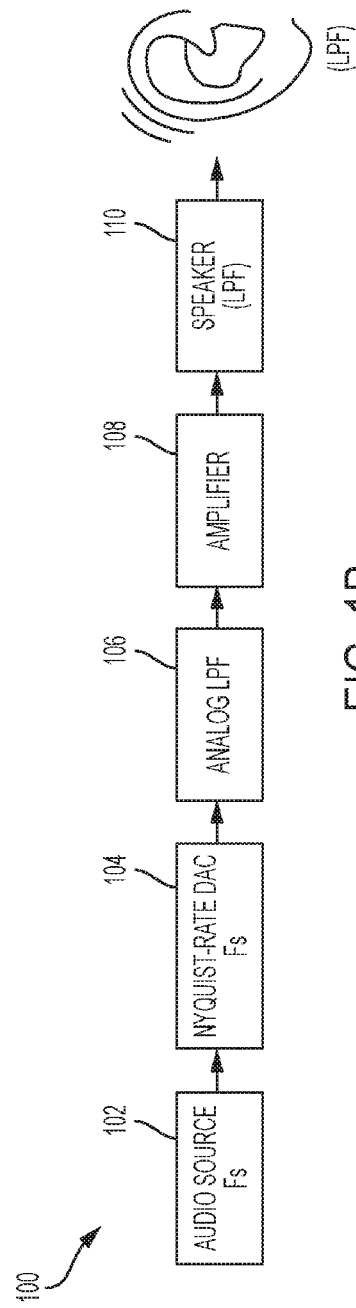
FIG. 1B is a block diagram illustrating an example playback path for digital audio according to the prior art.

After upsampling by the ASRC 412, the upsampled signals may be further processed within the single chip 410. For example, the upsampled signals may be passed to a digital low-pass filter 414 operating at the upsampled frequency, e.g., 64*Fs. Operation of the digital filter 414 at a high rate in this embodiment differs from conventional solutions, such as those in FIG. 1A and FIG. 1B, which often operate digital filters at a lowest possible sample rate to reduce power consumption. Operating the digital filter at the high frequency enables configuration of the filter with lower order filtering to improve the time domain response of the chip 410 without consuming significant additional power. The combination of the filter 414 with the ASRC 412 may emulate a system having a Nyquist-rate (non-oversampling) DAC followed by an analog low pass filter. An output of the digital filter 414 may be provided to a pulse-width modulation (PWM) modulator 416, also in the single chip 410 and operating at the upsampled frequency, e.g., 64*Fs. The modulated data may be output to a current-mode, or voltage-mode, digital-to-analog converter (DAC) 418 configured as an analog finite impulse response (FIR) filter operating at a higher frequency, e.g., 512*Fs. The current-mode DAC 418 may output a current signal to an amplifier 420 that may convert the current signal to a voltage signal and amplify the voltage signal to drive a load, such as a transducer shown as speaker 404. The speaker 404 may be part of a pair of headphones used by a user to listen to music or other sounds stored in digital data stored in the audio source 402.

The schematic flow chart diagram of FIG. 2 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although digital-to-analog converters (DACs) are described throughout the detailed description, aspects of the invention may be applied to the design of other converters, such as analog-to-digital converters (ADCs) and digital-to-digital converters, or other circuitry and components. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
   receiving an input signal at a first frequency;
   upsampling the input signal to achieve a plurality of samples at a second frequency higher than the first frequency that correspond to the input signal; and
   filtering, with a digital low pass filter that models an analog low pass filter, the upsampled plurality of samples, wherein the filtering implements a filter corner that is higher than a Nyquist frequency of the input signal,
   wherein the steps of upsampling and filtering model operation of a Nyquist digital-to-analog converter (DAC) and an analog low pass filter.

2. The method of claim 1, wherein the step of filtering comprises applying a filter with a filter corner that is at least double the Nyquist frequency of the input signal.

3. The method of claim 1, wherein the step of filtering produces a filtered plurality of samples having a linear phase response in an audio band.

4. The method of claim 1, further comprising:
   modulating the filtered plurality of samples at the second frequency; and
   driving an output with the modulated filtered plurality of samples.

5. The method of claim 4, wherein the step of driving the output comprises driving an amplifier for a transducer, wherein the input signal is an audio signal and the transducer reproduces sounds encoded in the audio signal.

6. The method of claim 1, wherein the first frequency and the second frequency are not related.

7. The method of claim 1, wherein the step of filtering results in nearly zero pre-ringing in the filtered upsampled plurality of samples.

8. The method of claim 1, wherein the step of sampling comprises applying a rectangular transform in a time domain to the plurality of samples to apply a Sinc transform in a frequency domain.

9. The method of claim 1, wherein the step of filtering comprises applying an approximation of a Butterworth filter to the upsampled plurality of samples with the digital low pass filter.

10. The method of claim 1, wherein the step of filtering comprises applying a fifth-order approximation of a Butterworth filter to the upsampled plurality of samples with the digital low pass filter.

11. The method of claim 1, wherein the step of filtering comprises applying an approximation of a Bessel filter to the upsampled plurality of samples with the digital low pass filter.

12. An apparatus, comprising:
    digital circuitry configured to perform steps comprising:
       receiving a digital input signal at a first frequency;
       upsampling the digital input signal to achieve a plurality of samples at a second frequency higher than the first frequency; and
       filtering, with a digital filter that models an analog low pass filter, the upsampled plurality of samples, wherein the filtering implements a filter corner that is higher than a Nyquist frequency of the input signal,
       wherein the steps of upsampling and filtering model operation of a Nyquist digital-to-analog converter (DAC) and an analog low pass filter.

13. The apparatus of claim 12, wherein the digital circuitry is configured to perform filtering by applying a filter with a filter corner that is at least double the Nyquist frequency of the input signal.

14. The apparatus of claim 12, wherein the filter is configured to produce a linear phase response in an audio band.

15. The apparatus of claim 12, wherein the digital circuitry is further configured to perform steps comprising:
    modulating the filtered plurality of samples at the second frequency; and
    driving an output with the modulated filtered plurality of samples.

16. The apparatus of claim 15, wherein the digital circuitry is configured to drive an amplifier for a transducer, wherein the input signal is an audio signal and the transducer reproduces sounds encoded in the audio signal.

17. The apparatus of claim 12, wherein the digital circuitry is configured to perform filtering by applying an approximation of a Butterworth filter to the upsampled plurality of samples.

18. The apparatus of claim 12, wherein the digital circuitry is configured to perform filtering by applying a fifth-order approximation of a Butterworth filter to the upsampled plurality of samples.

19. The apparatus of claim 12, wherein the digital circuitry is configured to perform filtering by applying an approximation of a Bessel filter to the upsampled plurality of samples.

20. An apparatus, comprising:
an input node for receiving a digital input signal;
an upsampling circuit coupled to the input node and configured to upsample digital data in the digital input signal to obtain a plurality of samples at a second frequency higher than a first frequency of the input signal; and
a digital filter coupled to the upsampling circuit and configured to filter the plurality of samples with a filter corner that is higher than a Nyquist frequency of the input signal,
wherein the upsampling circuit and the digital filter are configured to model operation of a Nyquist digital-to-analog converter (DAC) and an analog low pass filter.

21. The apparatus of claim 20, further comprising:
a pulse width modulation (PWM) modulator coupled to the digital filter; and
a digital-to-analog converter (DAC) coupled to the pulse width modulation (PWM) modulator and configured to output an analog signal corresponding to the received digital input signal.

22. The apparatus of claim 21, further comprising an amplifier coupled to the digital-to-analog converter (DAC) and configured to drive a transducer, wherein the input signal is an audio signal and the transducer reproduces sounds encoded in the audio signal.

23. The apparatus of claim 22, wherein the upsampling circuit, the digital filter, the pulse width modulation (PWM) modulator, the digital-to-analog converter, and the amplifier are integrated in a single integrated circuit (IC) chip.

24. The apparatus of claim 21, wherein the upsampling circuit is configured to perform zero-order holding to upsample the digital input signal to the second frequency.

25. The apparatus of claim 20, wherein the digital filter is configured to perform filtering by applying an approximation of a Butterworth filter to the plurality of samples.

26. The apparatus of claim 20, wherein the digital filter is configured to perform filtering by applying a fifth-order approximation of a Butterworth filter to the upsampled plurality of samples.

27. The apparatus of claim 20, wherein the digital circuitry is configured to perform filtering by applying an approximation of a Bessel filter to the upsampled plurality of samples.

* * * * *